(12) United States Patent
Yoneda et al.

(10) Patent No.: US 8,242,387 B2
(45) Date of Patent: Aug. 14, 2012

(54) ELECTRONIC COMPONENT STORING PACKAGE AND ELECTRONIC APPARATUS

(75) Inventors: Atsurou Yoneda, Higashiomi (JP); Tetsurou Abumita, Higashiomi (JP); Yoshiaki Ueda, Higashiomi (JP); Eiki Tsushima, Fuji (JP)

(73) Assignees: Kyocera Corporation, Kyoto (JP); FJ Composite Materials Co., Ltd., Shizuoka (JP)

( * ) Notice: Subject to any disclaimer, the term of this patent is extended or adjusted under 35 U.S.C. 154(b) by 579 days.

(21) Appl. No.: 12/375,514

(22) PCT Filed: Jul. 27, 2007

(86) PCT No.: PCT/JP2007/064805
§ 371 (c)(1),
(2), (4) Date: Oct. 7, 2009

(87) PCT Pub. No.: WO2008/013279
PCT Pub. Date: Jan. 31, 2008

(65) Prior Publication Data
US 2010/0059271 A1    Mar. 11, 2010

(30) Foreign Application Priority Data

Jul. 28, 2006 (JP) ................................. 2006-206109
Aug. 29, 2006 (JP) ................................. 2006-231682

(51) Int. Cl.
*H01L 23/49* (2006.01)
*H05K 5/06* (2006.01)
(52) U.S. Cl. ......... 174/538; 174/551; 257/706; 257/713
(58) Field of Classification Search .................. 257/706, 257/707, 713; 174/551, 538
See application file for complete search history.

(56) References Cited

U.S. PATENT DOCUMENTS
5,156,923 A * 10/1992 Jha et al. ........................ 428/614
(Continued)

FOREIGN PATENT DOCUMENTS
EP    1944116 A1    7/2008
(Continued)

OTHER PUBLICATIONS

Japanese language submission of publications by 3rd party dated Aug. 19, 2010 and its English language translation for corresponding Japanese application 2008526837 lists the references above.

*Primary Examiner* — Hung Ngo
(74) *Attorney, Agent, or Firm* — DLA Piper LLP (US)

(57) ABSTRACT

An electronic component storing package which generates a large quantity of heat during operation and an electronic apparatus storing such an electronic component are provided. In the electronic component storing package and the electronic apparatus, a heat dissipating member (1) is used which comprising at least five layers including first metal layers (11) having good thermal conductivity and second metal layers (12) having a smaller coefficient of thermal expansion and less thickness compared with the first metal layers (11), the first metal layers (11) and second metal layers (12) being alternately stacked, the first metal layers uppermost and lowermost layers of the layers, a thickness of at least one internally-arranged first metal layer (11a) being thicker than that of the lowermost and uppermost layers. Accordingly, heat generated from the electronic component (5) can be dissipated well to the outside, and a coefficient of thermal expansion of a mounting portion (1a) can be brought close to that of the electronic component (5) or the like.

9 Claims, 5 Drawing Sheets

U.S. PATENT DOCUMENTS

| | | | | |
|---|---|---|---|---|
| 5,276,423 A | * | 1/1994 | Breit et al. | 338/308 |
| 7,745,928 B2 | * | 6/2010 | Hasegawa | 257/712 |
| 2007/0194440 A1 | * | 8/2007 | Takashima et al. | 257/706 |
| 2009/0072386 A1 | * | 3/2009 | Hasegawa | 257/714 |
| 2009/0258248 A1 | | 10/2009 | Tsushima | |

FOREIGN PATENT DOCUMENTS

| | | |
|---|---|---|
| JP | 63041052 A | 2/1988 |
| JP | 03-218054 | 9/1991 |
| JP | 06268115 A | 9/1994 |
| JP | 10-173109 | 6/1998 |
| JP | 2002-076214 | 3/2002 |
| JP | 2002184890 A | 6/2002 |
| JP | 2003-053886 | 2/2003 |
| JP | 2003332479 A | 11/2003 |
| JP | 2004-249589 | 9/2004 |
| JP | 3862737 B | 10/2006 |
| JP | 2007-115731 | 5/2007 |

* cited by examiner

ELECTRONIC COMPONENT STORING PACKAGE AND ELECTRONIC APPARATUS

CROSS-REFERENCE TO THE RELATED APPLICATIONS

This application is a national stage of international application No. PCT/JP2007/064805 filed Jul. 27, 2007, which also claims the benefit of priority under 35 USC 119 to Japanese Patent Application No. 2006-206109 filed Jul. 28, 2006 and Japanese Patent Application No. 2006-231682 filed Aug. 29, 2006, the entire contents of which are incorporated herein by reference.

TECHNICAL FIELD

The present invention relates to an electronic component storing package, in which heat generated from the internally stored electronic component is dissipated well to the outside, and an electronic apparatus using this electronic component storing package.

BACKGROUND ART

In an electronic component storing package (hereinafter, also referred to simply as a "package") in which an electronic component such as a semiconductor component that generates heat is stored, a heat dissipating member with excellent thermal conductivity is used in a base member and the like. The heat dissipating member used in a base member and the like is required to have a good thermal conductivity and to have a coefficient of thermal expansion matching that of the electronic component. Also, the heat dissipating member is required to have properties such as high electrical conductivity. Since it is difficult for a single metal material to have all of these properties, a heat dissipating member that is made from a composite material in which a plurality of types of materials are combined has been used conventionally.

Figure 7:
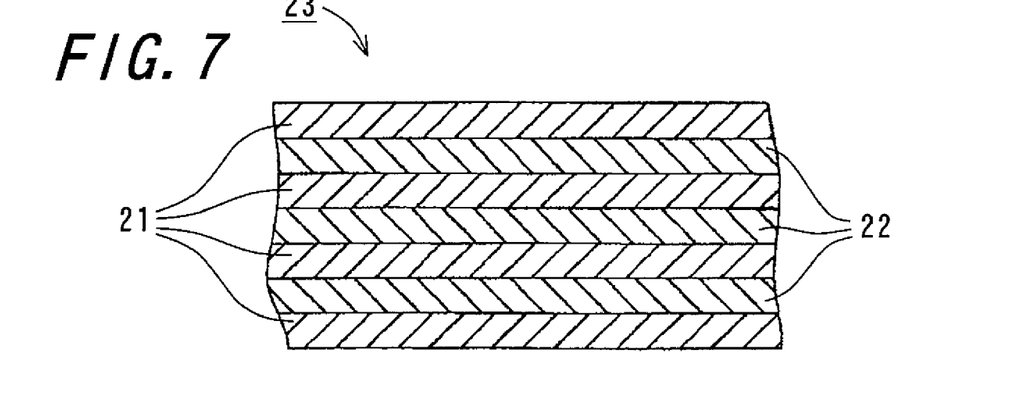
FIG. 7 is a cross-sectional view showing an example of a heat dissipating member according to the related art.

For example, Japanese Unexamined Patent Publication JP-A 2004-249589 discloses a heat dissipating member in which at least seven copper (Cu) plates 21 and molybdenum (Mo) plates 22 are stacked as shown in FIG. 7. This heat dissipating member 23 is produced by stacking the molybdenum layers and the copper layers so that the thickness of each single layer is 25% or less of the total plate thickness and then rolling the layers using a pressure-roller in a tensioned state. Furthermore, components such as a heat sink can be produced from the rolled composite material using a press-cutting machine or a press-punching machine.

Although not shown, Japanese Unexamined Patent Publication JP-A 3-218054 (1991) discloses, as an example of conventional heat dissipating members, a heat dissipating member that is made of a copper or copper alloy member, and any one of molybdenum, tungsten, and an alloy thereof that is securely attached to the copper or copper alloy member and whose thickness is 1/20 to 1/3 of that of the copper or copper alloy member.

However, in the above-described conventional heat dissipating members, the thermal conductivity is insufficient for recent electronic components that generate a large amount of heat in operation, and, thus, there is a problem in that the operation temperature of the electronic components may not be kept at the limit or lower.

Furthermore, there is also a problem in that it is difficult to provide good thermal conductivity and to control the coefficient of thermal expansion of the heat dissipating member at a desired value.

DISCLOSURE OF INVENTION

The invention has been devised in view of the above-described problems, and it is an object thereof to provide an electronic component storing package and an electronic apparatus, using a heat dissipating member having the good thermal conductivity and the coefficient of thermal expansion close to that of the electronic component.

The invention is directed to an electronic component storing package, comprising: a heat dissipating member comprising at least five layers including first metal layers and second metal layers, having a coefficient of thermal expansion smaller than the first metal layers, the first metal layers and second metal layers being alternately stacked, the first metal layers including uppermost and lowermost layers of the layers, a thickness of at least one internally-arranged first metal layer being thicker than that of the lowermost and uppermost layers; a terminal support arranged alongside of a region on a surface of the uppermost layer of the heat dissipating member on which an electronic component is to be mounted; and a conductor disposed on the terminal support.

In the electronic component storing package according to the invention, it is preferable that a main component of the first metal layers is copper or silver.

In the electronic component storing package according to the invention, it is preferable that a main component of the second metal layers is molybdenum or tungsten.

In the electronic component storing package according to the invention, it is preferable that the second metal layers adjacent to each other are arranged so that directions of extension of the second metal layers by rolling are perpendicular to each other.

In the electronic component storing package according to the invention, it is preferable that the thickness of the second metal layers is 30 μm or less.

In the electronic component storing package according to the invention, it is preferable that the first metal layers and the second metal layers are arranged to have symmetrical thicknesses with respect to a centrally-arranged metal layer.

In the electronic component storing package according to the invention, it is preferable that a side face of the respective second metal layers is covered with a side-face metal layer made of the same metal as the first metal layers.

In the electronic component storing package according to the invention, it is preferable that the side-face metal layer is formed by bringing outer peripheral portions of the first metal layers into pressure-contact with each other.

In the electronic component storing package according to the invention, it is preferable that a carrier is further bonded to a surface of the uppermost layer in the region of the heat dissipating member, the carrier comprising at least five layers including first metal layers and second metal layers, having a coefficient of thermal expansion smaller than the first metal layers, wherein the first metal layers and second metal layers are alternately stacked, uppermost and lowermost layers of the layers are first metal layers, and a thickness of at least one internally-arranged first metal layer of the first metal layers is thicker than that of each of the first metal layers disposed at the lowermost and uppermost layers.

Moreover, the invention is directed to an electronic apparatus, comprising: the electronic component storing package having the above-described configuration; an electronic component that is mounted on the region and whose electrode is electrically connected to the conductor; and a lid that is attached so as to confine the region or a sealing resin that covers the electronic component of the region.

BEST MODE FOR CARRYING OUT THE INVENTION

Figure 1A:
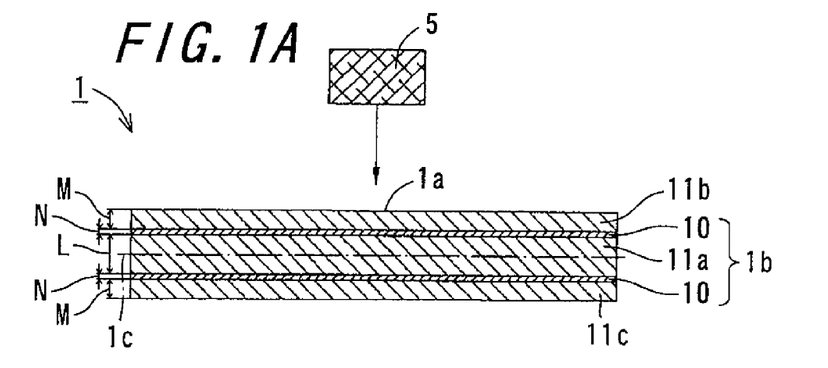
FIG. 1A is a cross-sectional view showing an example of a heat dissipating member used in an electronic component storing package.
Figure 1B:
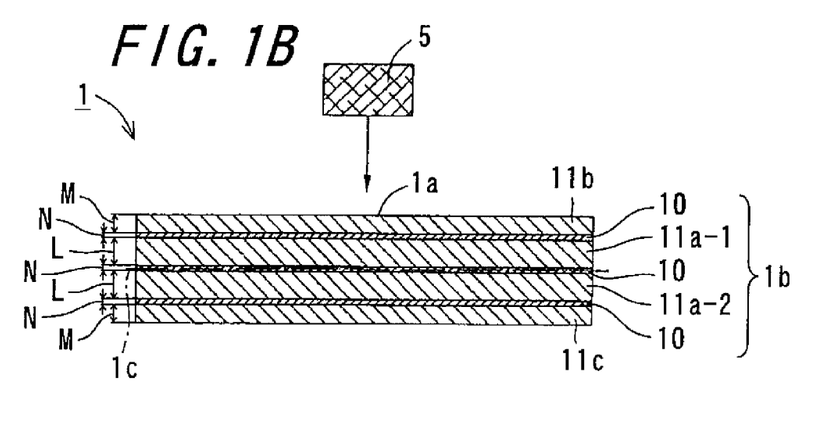
FIG. 1B is a cross-sectional view showing another example of a heat dissipating member used in an electronic component storing package.
Figure 1C:
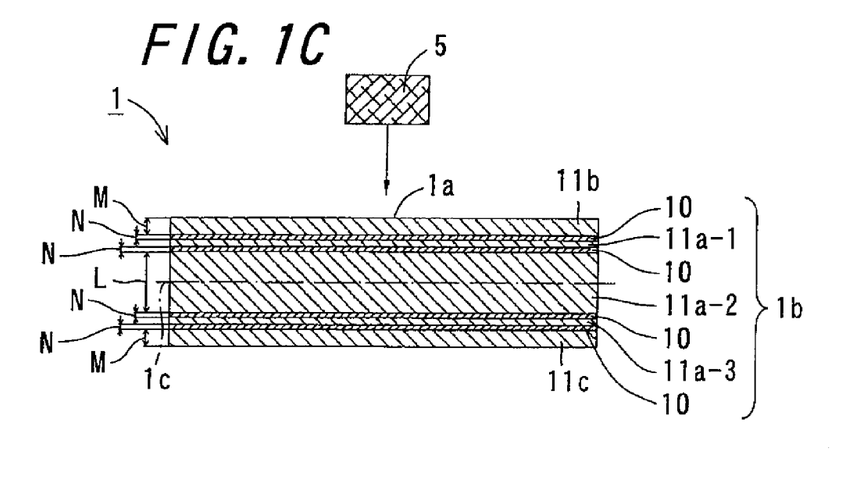
FIG. 1C is a cross-sectional view showing still another example of a heat dissipating member used in an electronic component storing package.

Hereinafter, an electronic component storing package and an electronic apparatus according to the invention are described in detail. FIG. 1A is a cross-sectional view showing an example of a heat dissipating member used in the electronic component storing package according to the invention. FIG. 1B is a cross-sectional view showing another example of the heat dissipating member used in the electronic component storing package according to the invention. FIG. 1C is a cross-sectional view showing another example of the heat dissipating member used in the electronic component storing package according to the invention.

Figure 2:
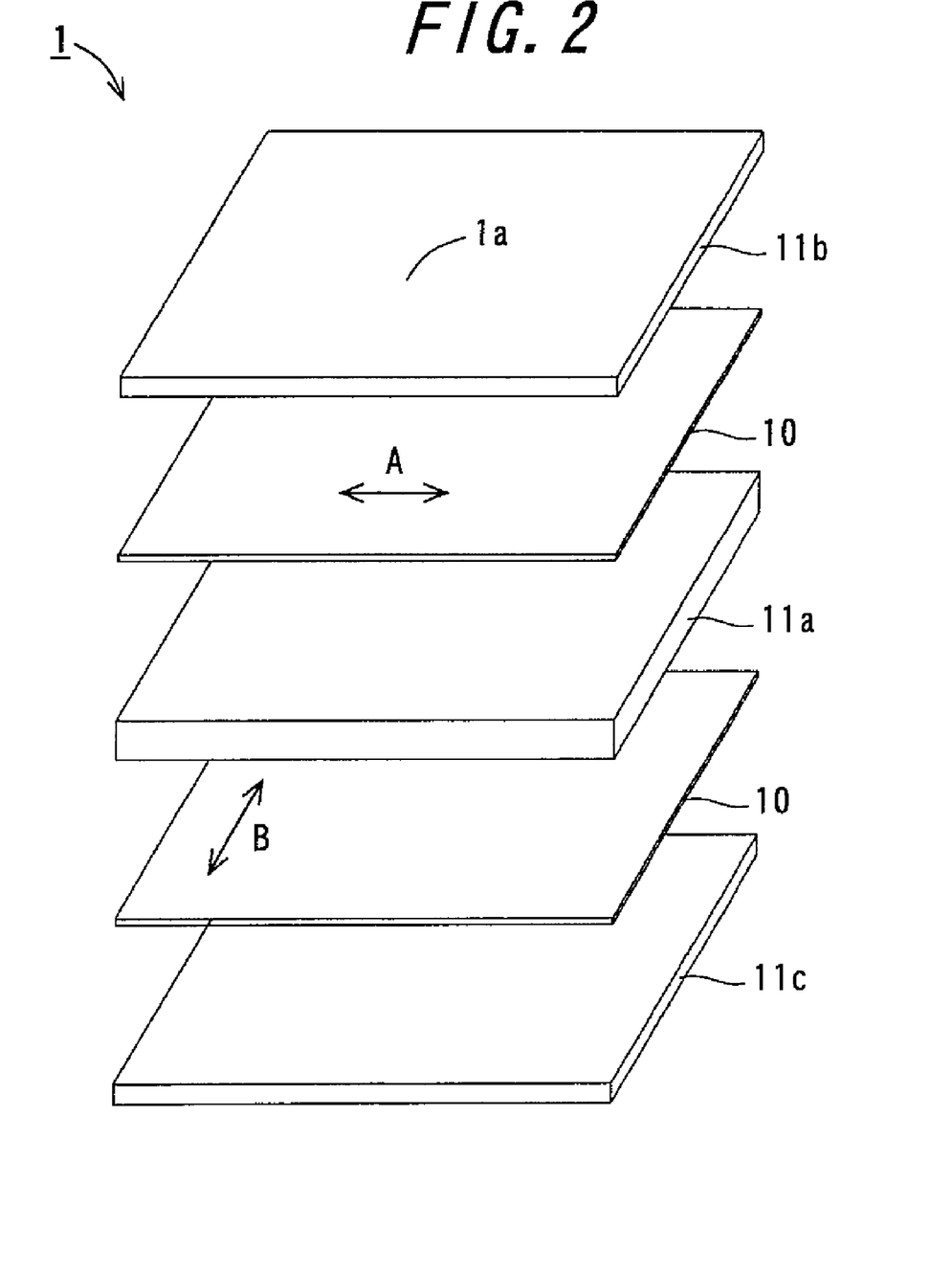
FIG. 2 is an assembly perspective view of the heat dissipating member shown in FIG. 1A.
Figure 3A:
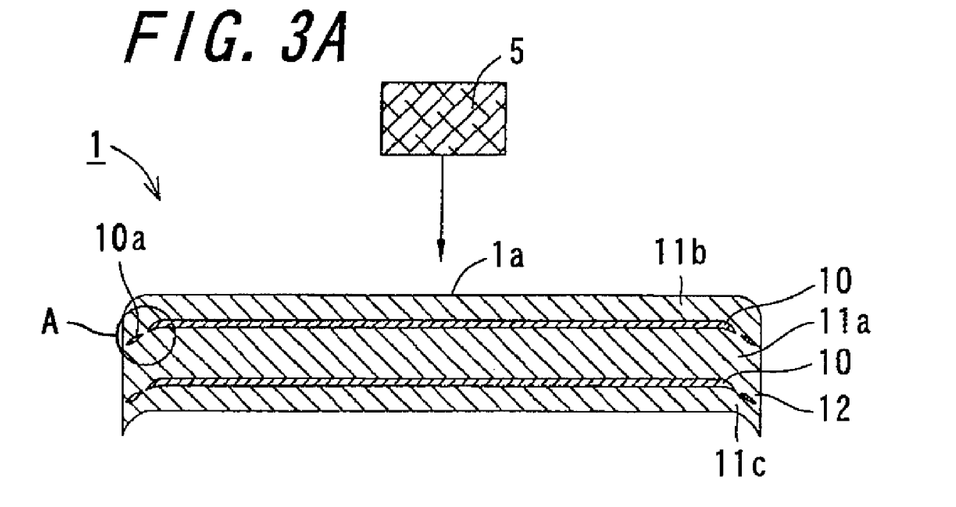
FIG. 3A is a cross-sectional view showing an example of a heat dissipating member used in an electronic component storing package according to the embodiment of the invention.
Figure 3B:
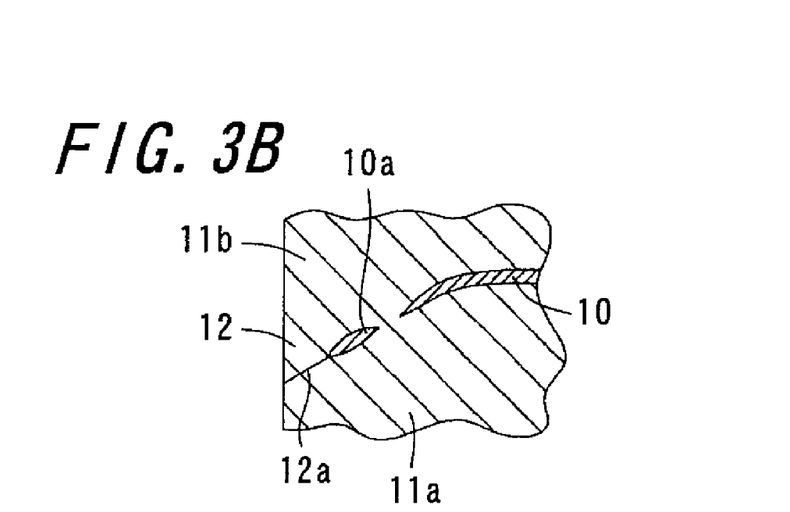
FIG. 3B is an enlarged cross-sectional view of a portion A in the heat dissipating member shown in FIG. 3A.
Figure 4:
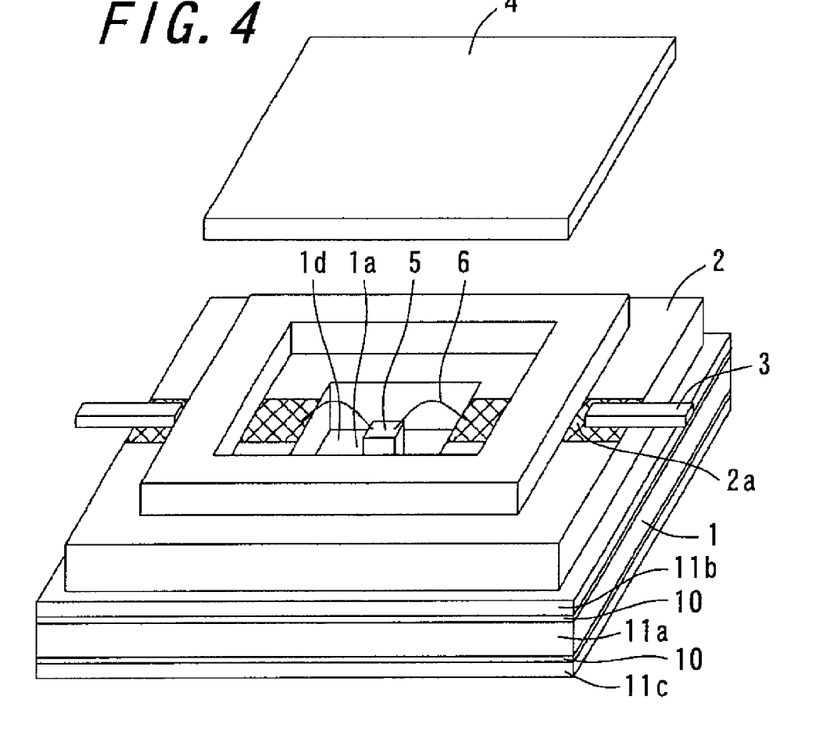
FIG. 4 is a perspective view of the electronic component storing package and the electronic apparatus according to an embodiment of the invention.
Figure 5:
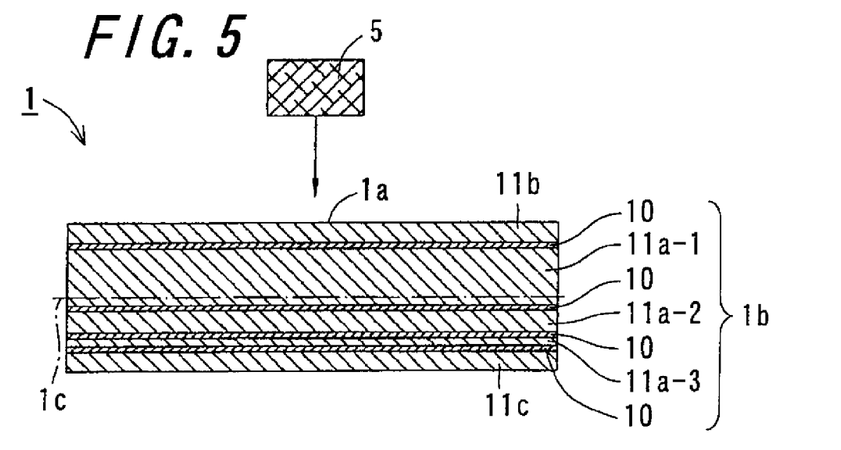
FIG. 5 is a cross-sectional view showing an example of the heat dissipating member used in the electronic component storing package according to another embodiment of the invention.
Figure 6:
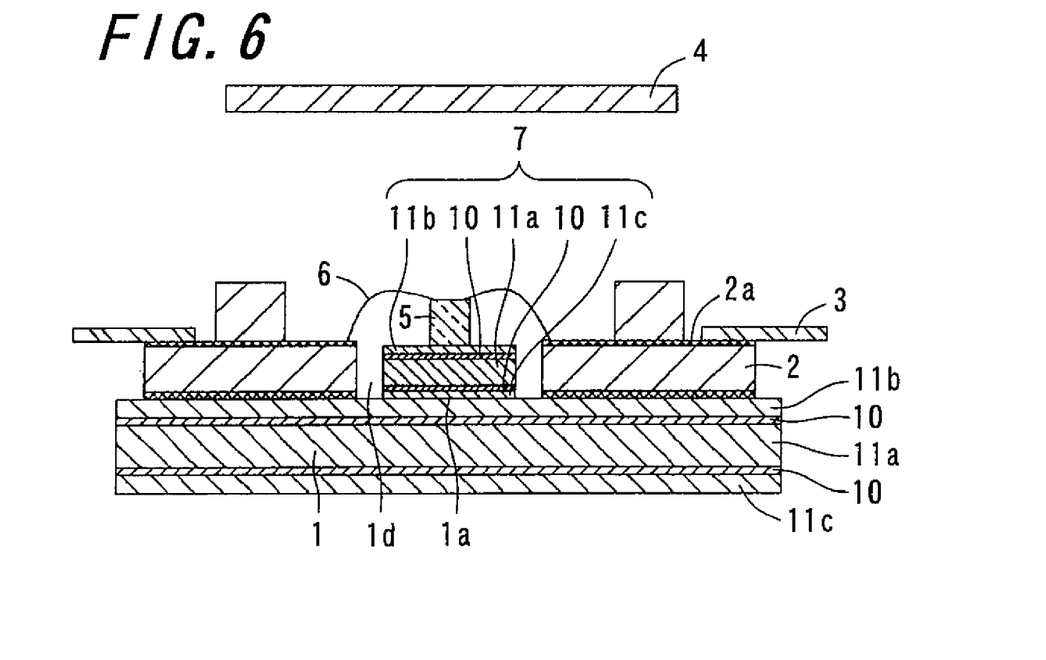
FIG. 6 is a cross-sectional view showing another example of the electronic component storing package and the electronic apparatus according to the embodiment of the invention shown in FIG. 4.

FIG. 2 is an assembly perspective view of the heat dissipating member used in the electronic component storing package according to the invention. FIG. 3A is a cross-sectional view for illustrating the main portions of the heat dissipating member after a cutting production process. FIG. 3B is an enlarged cross-sectional view of a portion A in the heat dissipating member shown in FIG. 3A. FIG. 4 is an assembly perspective view of the electronic component storing package and the electronic apparatus according to the invention using the heat dissipating member shown in FIG. 1A. FIG. 5 is a cross-sectional view showing another example of the heat dissipating member used in the electronic component storing package according to the invention. FIG. 6 is a cross-sectional view showing another example of the electronic component storing package and the electronic apparatus according to the invention.

In theses diagrams, a reference sign 1 denotes a heat dissipating member shaped in a flat plate in which a surface of an uppermost layer has a region 1a on which an electronic component 5 is mounted, a reference sign 1b denotes an intermediate layer, a reference sign 1c denotes a center line that indicates the center between the surface of the uppermost layer and a surface of a lowermost layer, a reference sign 10 denotes second metal layers, a reference sign 11 denotes first metal layers, a reference sign 11a denotes an internally-arranged first metal layer, a reference sign 11b denotes the uppermost first metal layer, a reference sign 11c denotes the lowermost first metal layer, a reference sign 12 denotes a side-face metal layer, a reference sign 2 denotes a frame body that is attached to the surface of the uppermost layer of the heat dissipating member 1 so as to enclose the region 1a and that functions as a terminal support, a reference sign 2a denotes a conductor that connects the region 1a enclosed by the frame body 2 and the outside of the frame body 2, a reference sign 4 denotes a lid that is attached to the upper face of the frame body 2 so as to confine the internal portions of the frame body 2, and a reference sign 5 denotes an electronic component such as a semiconductor element or resistor that generates heat. Here, in the case where there are a plurality of internally-arranged first metal layers 11a that are to be distinguished from each other, the layers are denoted by 11a-1, 11a-2, 11a-3, etc., sequentially from the upper layer positioned on the upper side in each diagram.

As long as the terminal support supports the conductor 2a, the terminal support is not limited to the frame body 2 shaped in a frame that encloses the mounting region 1a of the electronic component 5. For example, the terminal support may be an insulating material that has the conductor 2a and is disposed at a portion close to the region 1a. Furthermore, this terminal support may be disposed at one position of the outer periphery of the region 1a, or may be arranged in a divided manner at least two positions of the outer periphery. One end of the conductor 2a is connected to the electronic component 5, and the other end is connected to a circuit outside the electronic component storing package. Hereinafter, an example is described in which the frame body 2 is used as the terminal support.

The electronic component storing package that stores the electronic component 5 includes the heat dissipating member 1, the frame body 2 serving as the terminal support, and the conductor 2a. After the electronic component 5 is mounted on the electronic component mounting region 1a (hereinafter, also referred to as a "mounting portion 1a") of the heat dissipating member 1, the electronic component 5 is sealed by attaching the lid 4 to the upper face of the frame body 2 so as to confine a recessed region 1d enclosed by the heat dissipating member 1 and the frame body 2, or by applying a sealing resin not shown) to cover the electronic component 5 connected to the conductor 2a, and, thus, the electronic apparatus is produced.

The frame body 2 include an alumina ($Al_2O_3$)-based ceramics, an aluminum nitride (AlN)-based ceramics, a mullite ($3Al_2O_3 \cdot 2SiO_2$)-based ceramics, glass ceramics or other ceramics, or a metal with a low thermal expansion property such as iron (Fe)-nickel (Ni)-cobalt (Co) alloy or Fe—Ni alloy in which the coefficient of thermal expansion is close to that of the second metal layers 10. The frame body 2 is attached via a brazing filler metal to the surface of the uppermost layer of the heat dissipating member 1 so as to enclose the mounting portion 1a. For attachment using a brazing filler metal, a brazing metal layer (not shown) may be at a portion of the frame body 2 joined to the heat dissipating member 1.

In the case where the frame body 2 is made of a metal, the conductor 2a may be covered with an insulating material such as a ceramic, a resin, or a glass, in order to insulate the conductor 2a from the frame body 2 consisting of the metal. Furthermore, a resin may be used as the frame body 2.

The electronic component 5 is fixed via an adhesive material such as a resin, a glass, or a brazing filler metal, to the mounting portion 1a disposed at a central portion or the like on the surface of the uppermost layer of the heat dissipating member 1. In the case where a brazing filler metal is used as the adhesive material, a nickel (Ni) layer and/or a gold (Au) layer may be formed as a brazing metal layer (not shown) by plating or the like at a portion of the heat dissipating member 1 joined to the electronic component 5. Here, in the case where brazing can be sufficiently performed on the surface of the uppermost first metal layer 11b exposed on the mounting portion 1a of the heat dissipating member 1, the brazing metal layer is not particularly necessary.

For example, in the case where the frame body 2 is made of an $Al_2O_3$-based sintered compact, the frame body 2 is produced in the following manner. First, a slurry is formed by adding an appropriate organic binder, solvent, plasticizer, dispersant, and the like to a starting material powder such as $Al_2O_3$, silicon oxide ($SiO_2$), magnesium oxide (MgO), and calcium oxide (CaO) and mixing the resultant. Then, a ceramic green sheet (ceramic raw sheet) is formed from this slurry by doctor blading or calender rolling. Subsequently, this ceramic green sheet is subjected to an appropriate punching treatment, and a conductive paste formed by mixing an appropriate binder and solvent with a metal material powder, such as tungsten (W), Mo, manganese (Mn), Cu, silver (Ag), Ni, Au, or palladium (Pd), is applied by printing in a predetermined pattern for the conductor 2a by screen printing or the like. Then, a plurality of such green sheets are stacked and fired at a temperature of approximately 1600° C.

In the frame body 2, the conductor 2a is formed that extends from a portion near the mounting portion 1a, which lies on the inner face of the recessed portion 1d defined inside the frame body 2 by the heat dissipating member 1 and the frame body 2, to the outside of the frame body 2. One end of the conductor 2a inside the frame body 2 is electrically connected via electrically connecting means 6 such as a bonding wire to each electrode of the electronic component 5. The other end of the conductor 2a outside the frame body 2 is connected to a lead terminal 3 for connection with an external electric circuit board.

The conductor 2a includes a high-melting point metal such as W and/or Mo or a low-resistance metal such as Cu. A metal paste obtained by adding an appropriate organic binder, solvent, and the like to a metal powder such as W or Mo and mixing them. Then resultant is applied in a predetermined pattern by screen printing or the like on the ceramic green sheets that are to be formed into the frame body 2, and, thus, the conductor 2a is formed so as to be attached to the portion on the frame body 2.

In the case where a metal, such as Ni or Au, that has excellent corrosion resistance and an excellent bonding property as the electrically connecting means 6 is attached by plating as a layer having a thickness of 1 to 20 μm to an exposed surface of the conductor 2a, oxidation corrosion of the conductor 2a can be effectively prevented, and secured connection of the electrically connecting means 6 to the conductor 2a can be established.

The heat dissipating member 1 includes the intermediate layer 1b which includes at least three layers such as the second metal layers 10 and the internally-arranged first metal layer 11a, the second layers 10 and the internally-arranged first layer 11a are alternately stacked, the uppermost first metal layer 11b disposed on the upper surface of the intermediate layer 1b, and the lowermost first metal layer 11c that is disposed on the lower surface of the intermediate layer 1b. The uppermost first metal layer 11b has the mounting portion 1a on an upper surface on which the electronic component 5 is to be mounted. That is to say, when the internally-arranged first metal layer 11a of which thermal conductivity is excellent but a coefficient of thermal expansion is comparatively large, has, on both faces in a thickness direction of the layer, the second metal layers 10 of which coefficient of thermal expansion is smaller than that of the internally-arranged first metal layer 11a, a free thermal expansion of the internally-arranged first metal layer 11a is restricted by the second metal layers 10 disposed on both faces. Free thermal expansion of one face of each of the uppermost first metal layer 11b and the lowermost first metal layer 11c is restricted by the second metal layers 10 on one side of the face.

For example, as shown in FIG. 1A, in the heat dissipating member 1, five layers including an uppermost first metal layer 11b, a second metal layer 10, a internally-arranged first metal layer 11a, a second metal layer 10, and a lowermost first metal layer 11c are stacked in this order from above, a layer thickness L of the internally-arranged first metal layer 11a is larger than a layer thickness M of each of the uppermost first metal layer 11b and the lowermost first metal layer 11c, and a layer thickness N of the second metal layer 10 is smaller than the layer thickness M of each of the uppermost first metal layer 11b and the lowermost first metal layer 11c.

For example, as shown in FIG. 1B, in the heat dissipating member 1, seven layers including an uppermost first metal layer 11b, a second metal layer 10, a primary internally-arranged first metal layer 11a-1, a second metal layer 10, a secondary internally-arranged first metal layer 11a-2, a second metal layer 10, and a lowermost first metal layer 11c are stacked in this order from above, and a layer thickness L of each of the primary internally-arranged first metal layer 11a-1 and the secondary internally-arranged first metal layer 11a-2 is larger than a layer thickness M of each of the uppermost first metal layer 11b and the lowermost first metal layer 11c. A layer thickness N of the second metal layer 10 is smaller than the layer thickness M of each of the uppermost first metal layer 11b and the lowermost first metal layer 11c.

For example, as shown in FIG. 1C, in the heat dissipating member 1, nine layers including an uppermost first metal layer 11b, a second metal layer 10, a primary internally-arranged first metal layer 11a-1, a second metal layer 10, a secondary internally-arranged first metal layer 11a-2, a second metal layer 10, a tertiary internally-arranged first metal layer 11a-3, a second metal layer 10, and a lowermost first metal layer 11c are stacked in this order from above, and a layer thickness L of the secondary internally-arranged first metal layer 11a-2 is larger than a layer thickness M of each of the uppermost first metal layer 11b and the lowermost first metal layer 11c.

As in the example in FIG. 1C, a thickness of at least one of the internally-arranged first metal layers 11a is larger than that of each of the lowermost and uppermost first metal layers 11c and 11b. That is to say, the first metal layer 11 with the largest layer thickness is disposed in the intermediate layer 1b. In this example, the second metal layers 10 are thinner than the uppermost first metal layer 11b and the lowermost first metal layer 11c. The second metal layers 10 are made as thin as possible within a thickness range that can restrict thermal expansion of the first metal layers 11.

The heat dissipating member 1 has a function of conducting heat generated according to the operation of the electronic component 5 at the mounting portion be to the remote positions from the mounting portion 1a. Subsequently, the heat is dissipated through the air, or dissipated through an external radiator plate (not shown).

The second metal layers 10 constituting part of the heat dissipating member 1 are obtained, for example, by subjecting Mo, W, Fe, or an alloy thereof to a known conventional metal treatment such as rolling or punching. These metals have small coefficients of thermal expansion and are an excellent match for the coefficient of thermal expansion of an electronic component such as a semiconductor element, but have small thermal conductivity and large moduli of longitudinal elasticity. The second metal layers 10 are arranged only for suppressing thermal expansion of the heat dissipating member 1. Thus, the thickness of each of the second metal layers 10 is preferably as small as possible within a thickness range that can restrict the coefficient of thermal expansion so as to prevent the coefficient of thermal expansion of the entire heat dissipating member 1 from being large, and is smaller than thickness of each of the uppermost first metal layer 11b and the lowermost first metal layer 11c. The second metal layers 10 are internally arranged in the heat dissipating member 1 in a dispersed manner so as to prevent the coefficient of thermal expansion of the entire heat dissipating member 1 from being large.

In the heat dissipating member 1, even in the case where there are at least two second metal layers 10 and the thickness of each of the second metal layers 10 is reduced, at least two second metal layers 10 with a low thermal expansion property can restrict thermal expansion of the first metal layers 11 and prevent significant thermal expansion of the first metal layers 11, and, thus, the coefficient of thermal expansion in the planar direction (direction in which each layer extends) of the heat dissipating member 1 can be suppressed. Because the second metal layers 10 that are arranged on the thermal conduction path are thin, and, thus, thermal conduction in the thickness direction of the layers can be prevented from being obstructed, and heat dissipation of the heat dissipating member 1 can be improved. More specifically, it is confirmed that, even in the case where the thickness of each of the second metal layers 10 is reduced to 10 to 30 μm, thermal expansion of the first metal layers 11 can be sufficiently restricted. Furthermore, it is confirmed that, with this thickness, heat dissipation in the heat dissipating member 1 can be sufficiently assured.

The number of layers of the second metal layers 10 as small as possible is preferable (two, for example). With this configuration, thermal conduction does not deteriorate, and the thermal conductivity in the vertical direction (thickness direction) of the heat dissipating member 1 can be improved.

As shown in FIG. 2, in the second metal layers 10, the layers adjacent to each other in the vertical direction (the thickness direction of the heat dissipating member) are preferably stacked so that directions A and B of extension thereof by rolling are perpendicular to each other. Accordingly, the coefficients of thermal expansion of the heat dissipating member 1 in the length and width in the direction of the plane can be made substantially uniform. As a result, the dependency of the coefficient of thermal expansion in a particular direction of the plane can be avoided, and deformation such as warping can be prevented from occurring when bonding the frame body 2 by brazing.

The direction of extension by rolling refers to, for example, a direction in which a metal plate that is formed into the second metal layers 10 is extended in a rotational direction of a roller when extending the second metal layers 10 by rolling using a roller or the like. The coefficient of thermal expansion slightly varies depending on the direction of extension by rolling. In the case of rolling using a roller, fine rolling lines (streaks) are formed in the direction of extension, and, thus, the direction of extension by rolling can be confirmed based on the direction of these rolling lines. Also, the direction of extension by rolling can be confirmed using a method in which cross sections of the second metal layers 10 are observed using a SEM to confirm a shape of crystal grains.

The first metal layers 11 (the internally-arranged first metal layer 11a, the uppermost first metal layer 11b, and the lowermost first metal layer 11c) include a material of which the thermal conductivity is larger than that of the second metal layers 10, such as, for example, a metal material such as Cu, Ag, aluminum (Al), Au, or stainless steel (SUS), or an alloy thereof. However, these metal materials have large coefficients of thermal expansion and small moduli of longitudinal elasticity.

As shown in FIG. 1A, 1B, or 1C, the face on which the electronic component 5 is to be mounted is the first metal layer 11 (surface of the uppermost first metal layer 11b), and, thus, this face has a function of quickly conducting heat generated in the operation of the electronic component 5 at high thermal conductivity in the thickness direction and the direction of the plane of the layer through the uppermost first metal layer 11b. Then, the heat is dissipated from the face of the uppermost first metal layer 11b joined to the second metal layer 10, to an area wider than the area of the uppermost first metal layer 11b joined to the electronic component, and conducted to the second metal layer 10 that is disposed in the direction perpendicular to the direction of the plane of the layers (the thickness direction of the heat dissipating member 1). Subsequently, the heat sequentially passes through the internally-arranged first metal layer 11a and the second metal layer 10 that are stacked on each other, and is conducted from the lowermost first metal layer 11c to the outside of the heat dissipating member 1.

In order to dissipate heat also in the direction of the plane of each of the uppermost first metal layer 11b and the lowermost first metal layer 11c, it is preferable that the thickness of each of the metal layers 11b and 11c is 10 to 1000 μm, preferably 10 to 500 μm, and is approximately 1 to 100 times, preferably 1 to 50 times thickness of the second metal layer 10. In the case where the thickness of each of the uppermost first metal layer 11b and the lowermost first metal layer 11c is too large, it is difficult for the second metal layer 10 to sufficiently restrict thermal expansion of the uppermost first metal layer 11b. Furthermore, it is preferable that the thickness of the first metal layer 11a in the intermediate layer is 10 to 1000 μm, preferably 10 to 500 μm.

Here, at least one of the internally-arranged first metal layers 11a is thicker than any of the other metal layers 10, 11b, and 11c, and, the internally-arranged first metal layer 11a can dissipate heat in the direction of the plane of the metal layers, and the heat can be conducted via a wide face of the lowermost first metal layer 11c of the heat dissipating member 1 to the outside of the heat dissipating member 1. For this purpose, the internally-arranged first metal layer 11a is preferably as thick as possible. In the case where the number of the internally-arranged first metal layers 11a arranged is plural, each layer is preferably thick.

More preferably, all of the first metal layer 11 are thicker than the second metal layers 10. Since heat is conducted to the lower metal layers while being dissipated in the direction of the plane by each of the first metal layers 11, the thermal conductivity of the heat dissipating member 1 from the mounting portion 1a to the lowermost first metal layer 11c is improved.

On the other hand, the uppermost first metal layer 11b and the lowermost first metal layer 11c are thin, and, thus, thermal expansion of the outer surfaces of these metal layers 11b and 11c is firmly restricted by the second metal layers 10 adjacent to the metal layers 11b and 11c. Accordingly, the coefficient of thermal expansion of the heat dissipating member 1 can be a desired value close to the coefficient of thermal expansion of the electronic component 5.

As shown in FIGS. 1A, 1B, and 1C, the lower main face (the outer surface of the lowermost first metal layer 11c) of the heat dissipating member 1 is also the first metal layer 11 (the lowermost first metal layer 11c), and, thus, heat dissipation from the lowermost first metal layer 11c to an external radiator plate can be improved. In addition, the lowermost first metal layer 11c is a soft metal in which the modulus of longitudinal elasticity is small and the Vickers hardness is small, and, thus, the lower main face can be closely fitted to an external radiator plate and has excellent heat dissipation.

In the heat dissipating member 1, the metal layers 10 and 11 arranged on both sides of a centrally-arranged metal layer are preferably arranged to have symmetrical orders and metal layer thicknesses with respect to the centrally-arranged metal layer. Accordingly, the first metal layers 11 and the second metal layers 10 are arranged in a vertically symmetrical manner with respect to the center line 1c, which is the center between the outer surface of the uppermost first metal layer 11b and the outer surface of the lowermost first metal layer 11c and is the center of the centrally-arranged metal layer, and, thus, the coefficient of thermal expansion of a portion of the heat dissipating member 1 above the center line 1c is substantially the same as that of a portion of the heat dissipating member 1 below the center line 1c. Accordingly, the heat dissipating member 1 can be prevented from becoming warped. As a result, the surface of the heat dissipating member 1 can be kept flat, and, thus, even during the operation of the electronic component 5, the heat dissipating member 1 can be closely fitted to the electronic component 5 and the external radiator plate that is disposed on the lower surface of the heat dissipating member 1, and a heat dissipating property can be maintained.

For example, in FIG. 1A, the center line 1c is positioned at the center of the internally-arranged first metal layer 11a, and the metal layers arranged above the center line 1c and the metal layers arranged below are symmetrical with each other. In FIG. 1B, the center line 1c is positioned at the center of the central second metal layer 10, and the metal layers arranged above the center line 1c and the metal layers arranged below are symmetrical with each other. In FIG. 1C, the center line 1c is positioned at the center of the internally-arranged first metal layer 11a-2, and the metal layers arranged above the center line 1c and the metal layers arranged below are symmetrical with each other.

As shown in FIG. 5, the metal layers 10 and 11 arranged on both sides of the centrally-arranged metal layer may be arranged to have asymmetrical orders and metal layer thicknesses with respect to the centrally-arranged metal layer. Accordingly, the first metal layers 11 and the second metal layers 10 are arranged in a vertically asymmetrical manner with respect to the center line 1c which is the center between the outer surface of the uppermost first metal layer 11b and the outer surface of the lowermost first metal layer 11c, and, thus, the coefficient of thermal expansion of a portion of the heating member 1 above the center line 1c of the heat dissipating member 1 is different from that of a portion of the heating member 1 below the center line 1c. Accordingly, the heat dissipating member 1 can be warped by a change in temperature. For example, as shown in FIG. 5, in the case where the thickness of a portion of the first metal layers 11 above the center line 1c is larger than that of a portion of the first metal layers 11 below the center line 1c, the heat dissipating member 1 is warped so as to protrude downward according to a decrease in the temperature, and the bottom face of the heat dissipating member 1 protruding downward can easily come into contact with and be closely fitted to the external radiator plate. As a result, even in the case where a large amount of heat is generated from the electronic component 5, the heat generated from the electronic component 5 can be efficiently dissipated to the outside.

In the heat dissipating member 1, the first metal layers 11 (the uppermost first metal layer 11b, the internally-arranged first metal layer 11a, and the lowermost first metal layer 11c) are preferably made of Cu or Ag, and the second metal layers 10 are preferably made of Mo or W. Accordingly, the heat dissipation of the heat dissipating member 1 can be greatly improved, and the thermal expansion of the entire heat dissipating member 1 can be suppressed.

In the heat dissipating member 1, the first metal layers 11 (the internally-arranged first metal layer 11a, the uppermost first metal layer 11b, and the lowermost first metal layer 11c) and the second metal layers 10 are preferably stacked by hot uniaxial pressing, that is, so-called hot pressing in a vacuum atmosphere. With such hot pressing in a vacuum atmosphere, gases such as air are not interposed between the first metal layer 11 and the second metal layer 10, and oxide films and the like attached to the surfaces of the first metal layer 11 and the second metal layer 10 are also dissipated by vacuum treatment. Moreover, foreign substances attached to the surfaces of the first metal layer 11 and the second metal layer 10 are burned in a high temperature atmosphere. Then, the first metal layer 11 and the second metal layer 10 can be closely fitted and bonded to each other directly without foreign layers interposed therebetween. Thus, the thermal conductivity at the interface between the first metal layer 11 and the second metal layer 10 does not deteriorate. Accordingly, the thermal conductivity from the uppermost layer to the lowermost layer of the heat dissipating member 1 can be improved. Since the materials are heated to a high temperature (approximately 850° C.) during hot pressing, plastic deformation of the materials easily occurs, and, thus, the first metal layer 11 and the second metal layer 10 can be bonded to each other at a low pressure (approximately 600 KPa).

In the case where the first metal layers 11 and the second metal layers 10 are stacked by hot pressing in a vacuum atmosphere, no gap is formed between the first metal layer 11 and the second metal layer 10. Thus, during leakage inspections of the electronic component, an inspection gas does not enter a gap between the first metal layer 11 and the second metal layer 10. Accordingly, erroneous judgments during such leakage inspections (referred to as "pseudo-leakage") can be prevented.

The external shape of the heat dissipating member 1 is preferably formed by producing a stacked plate including at least five layers having the first metal layers 11 and the second metal layers 10, alternately stacked, by hot pressing in a vacuum atmosphere and then punching the stacked plate using a die. At that time, during the punching treatment of the first metal layers 11, the heat dissipating member 1 is deformed to form the side-face metal layer 12 having a thickness of 5 to 50 μm that covers the side face of the second metal layers 10.

The second metal layer 10 made of W or Mo has a poor plating property, and a plating metal layer is difficult to be attached to the second metal layers 10. However, the entire face of the heat dissipating member 1 has an excellent plating property, because the uppermost layer is the first metal layer 11, the lowermost layer is the first metal layer 11, and the entire periphery of the side face of the heat dissipating member 1 formed by stacking the layers is covered with the side-face metal layer 12 made of the same material as the first metal layer 11. Accordingly, a heat dissipating member 1 can be obtained in which oxidation corrosion does not occur on the surface thereof.

In the case where the entire periphery of the side face of the first metal layers 11 and the second metal layers 10 that are stacked on each other is covered with the side-face metal layer 12 made of the same material as the first metal layers 11, it is possible to prevent problems from occurring, for example, in which the heat dissipating member 1 is corroded from a point between the first metal layer 11 and the second metal layer 10, or in which, when a plating metal layer is attached to the surface of the heat dissipating member 1, a plating solution enters a portion between the first metal layer 11 and the second metal layer 10 and seeps out after plating.

In addition, the first metal layer 11 and the side-face metal layer 12 are superior to the second metal layers 10 also in electrical conductivity. Thus, in the case where the face on which the electronic component 5 is to be mounted is the first metal layer 11 (the uppermost first metal layer 11b) and the entire periphery of the side face of the stacked layers is covered with the side-face metal layer 12 made of the same material as the first metal layer 11, the uppermost first metal layer 11b constituting a ground conductor is electrically connected with excellent electrical conductivity via the side-face metal layer 12 to the lowermost first metal layer 11c. That is to say, grounding of the uppermost first metal layer 11b is reinforced, and, thus, when the electronic component 5 that operates in response to high frequency signals is mounted on the heat dissipating member 1, the response property of the electronic component 5 to the high frequency signals become excellent.

As shown in FIG. 3A, when the outer shape of the heat dissipating member 1 is formed by punching treatment, the outer peripheral portion of the first metal layer 11 is droopingly deformed, and the adjacent outer peripheral portions of the first metal layers 11 can be closely fitted to each other, thereby forming the side-face metal layer 12. The droopingly deformed first metal layer 11, that is, the side-face metal layer 12 is brought into contact via an interface 12a with the lower first metal layer 11 by the pressure applied during the punching treatment. Here, FIG. 3A shows the case in which punching has been performed by moving a male die of a punching die toward a female die in a state where the male die is placed on the side of the lowermost first metal layer 11c and the female die is placed on the side of the uppermost first metal layer 11b.

When punching the heat dissipating member 1, a broken piece 10a may be formed in the vicinity of the outer peripheral portion of the heat dissipating member 1 as shown in FIGS. 3A and 3B, because the second metal layers 10 have high rigidity and less ductility than the first metal layers 11. Even in this case, the broken piece 10a is surrounded by and embedded in the material of the first metal layers 11, and the side-face metal layer 12 made of the first metal can be connected around the broken piece 10a.

The thickness of the side-face metal layer 12 can be set to 10 to 25 μm by adjusting the clearance between the female die and the male die of the punching die. Accordingly, the side face of the second metal layers 10 can be reliably covered with the side-face metal layer 12 without being exposed, and, thus, the heat dissipating member 1 has an excellent plating property. Accordingly, a heat dissipating member 1 can be obtained in which oxidation corrosion does not occur. In the case where the thickness of the side-face metal layer 12 is larger than 25 μm, vertical stress in the side-face metal layer 12 caused by thermal expansion may be increased, and, thus, the side-face metal layer 12 tends to be detached or deformed.

As shown in FIG. 6, the mounting portion is may be provided with a carrier 7 arranged on a surface of the uppermost first metal layer 11b of the heat dissipating member 1, which carrier includes at least five layers having the first metal layers 11 and the second metal layers 10 alternately stacked, the lowermost layer and the uppermost layer of the five layers are the first metal layers 11b and 11c, and a thickness of at least one of the internally-arranged first metal layers 11a is larger than that of each of the first metal layers 11b and 11c arranged as the lowermost and uppermost layers.

More specifically, the heat dissipating member 1a obtained by cutting the heat dissipating member 1 into a portion having a small area according to the shape of the mounting portion 1a is placed as the carrier 7 on the mounting portion 1a is of the electronic component storing package of the invention, and the electronic component 5 is mounted on the upper face of the carrier 7.

In this case, even in the case where the electronic component 5 is thin, the distance between each electrode of the electronic component 5 and the conductor 2a can be reduced by mounting the electronic component 5 on the carrier 7. Since the length of the electrically connecting means 6, such as a bonding wire, between each electrode of the electronic component 5 and the conductor 2a can be reduced, loss of electric signal transmission occurring at the electrically connecting means 6 can be suppressed to the extent possible. When the electronic component 5 is mounted via the carrier 7 on the mounting portion 1a, external dissipation of the heat generated from the electronic component 5 is not significantly impaired, because the thermal conductivity of the carrier 7 is good.

The carrier 7 may be bonded via a brazing filler metal, such as Ag—Cu brazing filler metal, to the upper main face of the heat dissipating member 10, or may be stacked integrally with the heat dissipating member 1 by hot uniaxial pressing.

Here, in the case where the first metal layers are made of Cu, this material is not limited to pure Cu, and it is also possible to use various types of Cu alloys whose main component is Cu, as long as the thermal conductivity is good and the strength of the bonding with the second metal layer 10 is sufficient.

Also, in the case where the first metal layers are made of other materials such as Ag or Al, the materials do not have to be pure metal, as described above.

In this manner, according to the above-described package, the electronic component 5 is adhesively fixed via an adhesive material including a glass, a resin, or a brazing filler metal to the mounting portion 1a of the heat dissipating member 1, and each electrode of the electronic component 5 is electrically connected via the electrically connecting means 6, such as a bonding wire, to the corresponding conductor 2a. Subsequently, a sealing resin such as epoxy resin is injected into the recessed portion 1d defined by the heat dissipating member 1 and the frame body 2 so as to cover the electronic component 5, thereby sealing the electronic component 5. Alternatively, the lid 4 made of a resin, a metal, or a ceramic is attached to the upper face of the frame body 2 so as to cover and confine the recessed portion 1d, thereby sealing the electronic component 5. Thus, an electronic apparatus as a product is obtained.

EXAMPLE 1

As a specific configuration of the heat dissipating member 1, a heat dissipating member was produced in which the number of the layers was five as shown in FIGS. 1A and 3A, each of the uppermost first metal layer 11b and the lowermost first metal layer 11c was made of Cu with a purity of 99.6% and had a thickness of 0.1 mm, the internally-arranged first metal layer 11a was made of Cu with a purity of 99.6% and had a thickness of 0.8 mm, each of the two second metal layers 10 was made of Mo with a purity of 99.6% and had a thickness of 25 μm, and the side-face metal layer 12 had a thickness of 25 μm. As a result, heat dissipation of the heat dissipating member 1 was greatly improved (the thermal conductivity between the upper and the lower faces: 400 W/m·K), and the thermal expansion of the entire heat dissipating member 1 was effectively suppressed (the coefficient of thermal expansion in the direction of the plane: $9.0 \times 10^{-6}$/K).

EXAMPLE 2

Cu plates with a purity of 99.6%, each having a predetermined thickness, that were formed into the first metal layers 11 (the internally-arranged first metal layer 11a, the uppermost first metal layer 11b, and the lowermost first metal layer 11c), and Mo plates with a purity of 99.6%, each having a predetermined thickness, that were formed into the second metal layers 10, each plate having a size of 300 mm in length× 300 mm in width in a plan view, were sequentially stacked from the lowermost layer to the uppermost layer as in the arrangement from the lower row to the upper row in Table 1. Then, the layers were subjected to hot pressing in which a pressure of 600 KPa was applied at 850° C. in a vacuum environment, thereby producing a stacked plate. Subsequently, the produced stacked plate including the first metal layers 11 and the second metal layers 10 was punched using a punching die, thereby producing three samples for each of Samples A, B, C, and D of the heat dissipating member 1 shaped in a circular plate having a diameter of 10.2 mm. Here, the thickness of each metal layer shown in Table 1 indicates the thickness of the layer that was stacked. Furthermore, the thickness of the side-face metal layer 12 was set to 25 μm by adjusting the clearance between the female die and the male die of the punching die. In Table 1, a blank field indicates that there was no corresponding metal layer. That is to say, for example, it is indicated that Sample C was a heat dissipating member 1 that included seven layers consisting of a 0.1 mm-thick Cu layer, a 0.025 mm-thick Mo layer, a 0.8 mm-thick Cu layer, a 0.025 mm-thick Mo layer, a 0.8 mm-thick Cu layer, a 0.025 mm-thick Mo layer, and a 0.1 mm-thick Cu layer, which were sequentially stacked.

TABLE 1

Layer configuration and thickness of each layer of Samples A, B, C, and D (unit: mm)

|    | Sample A | Sample B | Sample C | Sample D |
|----|----------|----------|----------|----------|
| Cu | 0.1      | —        | —        | —        |
| Mo | 0.01     | —        | —        | —        |
| Cu | 0.2      | —        | —        | 0.1      |
| Mo | 0.01     | —        | —        | 0.025    |
| Cu | 0.2      | —        | —        | 0.01     |
| Mo | 0.01     | —        | —        | 0.025    |
| Cu | 0.2      | —        | —        | 0.01     |
| Mo | 0.01     | —        | —        | 0.025    |
| Cu | 0.2      | 0.1      | 0.1      | 0.6      |
| Mo | 0.01     | 0.025    | 0.025    | 0.025    |
| Cu | 0.2      | 0.6      | 0.8      | 0.01     |
| Mo | 0.01     | 0.025    | 0.025    | 0.025    |
| Cu | 0.2      | 0.6      | 0.8      | 0.01     |

TABLE 1-continued

Layer configuration and thickness of each layer of Samples A, B, C, and D (unit: mm)

|    | Sample A | Sample B | Sample C | Sample D |
|----|----------|----------|----------|----------|
| Mo | 0.01     | 0.025    | 0.025    | 0.025    |
| Cu | 0.1      | 0.1      | 0.1      | 0.1      |
| Total thickness | 1.470 | 1.475 | 1.875 | 0.990 |

Three samples each of Samples A, B, C, and D, that is, 12 samples in total were subjected to measurements using a laser flash method to obtain the thermal, conductivity in the vertical direction (thickness direction) of the heat dissipating member 1 based on the temperature history curves of the lower main faces during irradiation with laser beams of the upper main faces of the samples. The measurements were performed using an apparatus (machine type number; TC-700, manufactured by SHINKU RIKO K.K.) in a measurement environment in which the measurement temperature was 25° C. and the humidity was 68%, following the procedure of JISR1611. Table 2 shows the results obtained by measuring the thermal conductivity in the vertical direction (thickness direction) of the Samples A, B, C, and n using the laser flash method.

TABLE 2

Measurement results for the thermal conductivity of Samples A, B, C, and D (unit: W/m · K)

|                   | Sample A | Sample B | Sample C | Sample D |
|-------------------|----------|----------|----------|----------|
| 1st Measured value | 390     | 390      | 405      | 318      |
| 2nd Measured value | 387     | 413      | 429      | 323      |
| 3rd Measured value | 381     | 402      | 395      | 324      |
| Average value     | 386      | 402      | 410      | 322      |

As shown in Table 2, the thermal conductivities of the samples were as follows: 381 W/m·K or more (average value 386 W/m·K) for Sample A, 390 W/m·K or more (average value 402 W/m·K) for Sample B, 395 W/m·K or more (average value 410 W/m·K) for Sample C, and 318 W/m·K or more (average value 322 W/m·K) for Sample D.

EXAMPLE 3

The samples of Sample B produced in Example 2 were placed on a heater block and heated, and the coefficients of thermal expansion of the surfaces of the uppermost first metal layers 11b were measured. The coefficients of thermal expansion of the surfaces of the uppermost first metal layers 11b were measured in the following manner. First, the three types of strain gauges having coefficients of thermal expansion of, for example, $5.0 \times 10^{-6}$/K, $9.0 \times 10^{-6}$/K, and $10.8 \times 10^{-6}$/K had been attached to the central portions of the surfaces of the uppermost first metal layers 11b were placed on the heater block and heated at 300° C. for five minutes. Then, the strain due to a difference in thermal expansion between the samples of Sample B of the heat dissipating member 1 and the strain gauges at 300° C. was measured.

In the case where the strain value of the strain gauge is 0, the coefficient of thermal expansion of Sample B of the heat dissipating member 1 matches that of the strain gauge, and an approximate coefficient of thermal expansion of Sample B of the heat dissipating member 1 at 300° C. can be obtained.

The strain values for the samples of Sample B were measured using a strain gauge SKF-25552 (manufactured by KYOWA ELECTRONIC INSTRUMENTS CO., LTD.) having a coefficient of thermal expansion of $5.0\times10^{-6}$/K, a strain gauge SKF-25553 (manufactured by KYOWA ELECTRONIC INSTRUMENTS CO., LTD.) having a coefficient of thermal expansion of $9.0\times10^{-6}$/K, and a strain gauge KFU-2-120-C1-11H1M3 (manufactured by KYOWA ELECTRONIC INSTRUMENTS CO., LTD.) having a coefficient of thermal expansion of $10.8\times10^{-6}$/K.

As a result, the strain value in the strain gauge having a coefficient of thermal expansion of $5.0\times10^{-6}$/K was approximately $1750\times10^{-6}$, the strain value in the strain gauge having a coefficient of thermal expansion of $9.0\times10^{-6}$/K was approximately $750\times10^{-6}$, and the strain value in the strain gauge having a coefficient of thermal expansion of $10.8\times10^{-6}$/K was approximately $170\times10^{-6}$.

Next, the three measurement results were plotted on a graph in which the vertical axis indicated the coefficient of thermal expansion of the strain gauge and the horizontal axis indicated the strain value, and the three points were connected to form a straight line. Then, the coefficient of thermal expansion when the strain value was 0 was obtained from this straight line. That is to say, the coefficient of thermal expansion was obtained of the point where the straight line and the vertical axis intersected. As a result, it was seen that the coefficient of thermal expansion at the intersecting point was approximately $11.6\times10^{-6}$/K. Accordingly, it was seen that the coefficient of thermal expansion ($19.0\times10^{-6}$/K) of the first metal layers 11 was restricted by the second metal layers 10 to the above-described appropriate coefficient of thermal expansion. A coefficient of thermal expansion of $11.6\times10^{-6}$/K is close to the coefficient of thermal expansion of $7.8\times10^{-6}$/K for the frame body 2 made of an $Al_2O_3$-based ceramics. Thus, thermal strain is not caused in the electronic component storing package of the invention by the difference in thermal expansion between the base member 1 and the frame body 2, and the sealing property of the electronic component storing package, the properties of a semiconductor element that is to be mounted, and the like are not adversely affected by such thermal strain.

In this manner, the thickness of each of the first metal layers 11 and the second metal layers 10 is adjusted, and, thus, a heat dissipating member 1 can be obtained in which the coefficient of thermal expansion is a desired value smaller than that in the case where only the first metal layers 11 are used.

Here, the invention is not limited to the foregoing embodiments and examples, and various modifications are possible within a range not departing from the gist of the invention. For example, a circuit board made of a ceramic may be mounted, instead of the discrete electronic component 5 on the mounting portion 1a, on the surface of the uppermost layer of the heat dissipating member 1, and the electronic component 5 may be mounted on this circuit board. With this configuration, heat generated from the electronic component 5 mounted on the circuit board can be efficiently dissipated without causing damage such as cracking in the circuit board.

Furthermore, in the foregoing embodiments and examples, terms such as upper, lower, left, and right are used simply for illustrating the positional relationship in the drawings, and do not refer to the positional relationship in actual use.

The invention claimed is:

1. An electronic component storing package, comprising:
a heat dissipating member comprising at least five layers including first metal layers and second metal layers, having a coefficient of thermal expansion smaller than the first metal layers, the first metal layers and second metal layers being alternately stacked, the first metal layers including uppermost and lowermost layers of the layers, a thickness of at least one internally-arranged first metal layer being thicker than that of the lowermost and uppermost layers, and the second metal layers adjacent to each other being arranged so that directions of extension of the second metal layers by rolling are perpendicular to each other;
a terminal support arranged alongside of a region on a surface of the uppermost layer of the heat dissipating member on which an electronic component is to be mounted; and
a conductor disposed on the terminal support.

2. The electronic component storing package of claim 1, wherein a main component of the first metal layers is copper or silver.

3. The electronic component storing package of claim 1, wherein a main component of the second metal layers is molybdenum or tungsten.

4. The electronic component storing package of claim 1, wherein the thickness of the second metal layers is 30 μm or less.

5. The electronic component storing package of claim 1, wherein the first metal layers and the second metal layers are arranged to have symmetrical thicknesses with respect to a centrally-arranged metal layer.

6. An electronic apparatus, comprising: the electronic component storing package of claim 1; an electronic component that is mounted on the region and whose electrode is electrically connected to the conductor; and a lid that is attached so as to confine the region or a sealing resin that covers the electronic component of the region.

7. An electronic component storing package, comprising:
a heat dissipating member comprising at least five layers including first metal layers and second metal layers, having a coefficient of thermal expansion smaller than the first metal layers, the first metal layers and second metal layers being alternately stacked, the first metal layers including uppermost and lowermost layers of the layers, a thickness of at least one internally-arranged first metal layer being thicker than that of the lowermost and uppermost layers;
a terminal support arranged alongside of a region on a surface of the uppermost layer of the heat dissipating member on which an electronic component is to be mounted; and
a conductor disposed on the terminal support,
wherein a side face of the respective second metal layers is covered with a side-face metal layer made of the same metal as the first metal layers.

8. The electronic component storing package of claim 7, wherein the side-face metal layer is formed by bringing outer peripheral portions of the first metal layers into pressure-contact with each other.

9. An electronic component storing package, comprising:
a heat dissipating member comprising at least five layers including first metal layers and second metal layers, having a coefficient of thermal expansion smaller than the first metal layers, the first metal layers and second metal layers being alternately stacked, the first metal layers including uppermost and lowermost layers of the layers, a thickness of at least one internally-arranged first metal layer being thicker than that of the lowermost and uppermost layers;

a terminal support arranged alongside of a region on a surface of the uppermost layer of the heat dissipating member on which an electronic component is to be mounted; and a conductor disposed on the terminal support, wherein a carrier is further bonded to a surface of the uppermost layer in the region of the heat dissipating member, the carrier comprising at least five layers including first metal layers and second metal layers, having a coefficient of thermal expansion smaller than the first metal layers, wherein the first metal layers and second metal layers are alternately stacked, uppermost and lowermost layers of the layers are first metal layers, and a thickness of at least one internally-arranged first metal layer of the first metal layers is thicker than that of each of the first metal layers disposed at the lowermost and uppermost layers.

* * * * *